United States Patent
Chen et al.

(10) Patent No.: US 7,324,835 B2
(45) Date of Patent: Jan. 29, 2008

(54) MOTHERBOARD AND DAUGHTERBOARD MULTI-SWAP SYSTEM WITH COMMUNICATION MODULE FOR A GPRS SYSTEM

(75) Inventors: Jui-Chung Chen, Hsin Chu (TW); Forli Wen, Hsinchu (TW); Gordon Yu, Hsin Chu (TW)

(73) Assignee: C-One Technology Corporation, Hsinchu (TW)

( * ) Notice: Subject to any disclaimer, the term of this patent is extended or adjusted under 35 U.S.C. 154(b) by 296 days.

(21) Appl. No.: 10/914,558

(22) Filed: Aug. 7, 2004

(65) Prior Publication Data

US 2006/0029094 A1 Feb. 9, 2006

(51) Int. Cl.
*H04B 1/38* (2006.01)

(52) U.S. Cl. .................................................. 455/558

(58) Field of Classification Search ............... 455/563, 455/558, 557, 568, 347, 559; 712/227
See application file for complete search history.

(56) References Cited

U.S. PATENT DOCUMENTS

| | | | |
|---|---|---|---|
| 4,455,703 A | 6/1984 | Fromme et al. | |
| 4,662,021 A | 5/1987 | Hagen et al. | |
| 4,718,136 A | 1/1988 | Fisher et al. | |
| 5,497,411 A * | 3/1996 | Pellerin | 455/411 |
| 5,604,871 A * | 2/1997 | Pecone | 710/301 |
| 5,703,759 A * | 12/1997 | Trimberger | 361/777 |
| 5,711,013 A * | 1/1998 | Collett et al. | 455/558 |
| 5,734,872 A * | 3/1998 | Kelly | 703/20 |
| 5,854,981 A * | 12/1998 | Wallstedt et al. | 455/439 |
| 5,974,318 A * | 10/1999 | Satarasinghe | 455/436 |
| 6,289,440 B1 * | 9/2001 | Casselman | 712/227 |
| 6,714,647 B1 * | 3/2004 | Cowan et al. | 379/413.02 |
| 6,742,068 B2 * | 5/2004 | Gallagher et al. | 710/302 |
| 6,973,693 B1 | 12/2005 | Mayer et al. | |
| 2001/0011314 A1 * | 8/2001 | Gallagher et al. | 710/103 |
| 2001/0035866 A1 * | 11/2001 | Finger et al. | 345/568 |
| 2002/0034966 A1 * | 3/2002 | Saito et al. | 455/558 |
| 2002/0082047 A1 * | 6/2002 | Souissi et al. | 455/557 |
| 2002/0098830 A1 * | 7/2002 | Lauper et al. | 455/411 |
| 2002/0137505 A1 * | 9/2002 | Eiche et al. | 455/425 |
| 2002/0156797 A1 * | 10/2002 | Lee et al. | 707/200 |
| 2002/0166062 A1 * | 11/2002 | Helbig, Sr. | 713/200 |
| 2002/0183009 A1 * | 12/2002 | Cruz-Albrecht et al. | 455/66 |
| 2002/0198022 A1 * | 12/2002 | Huber | 455/557 |
| 2003/0008680 A1 * | 1/2003 | Huh et al. | 455/557 |
| 2003/0097350 A1 * | 5/2003 | ShamRao | 707/1 |
| 2003/0125073 A1 * | 7/2003 | Tsai et al. | 455/552 |
| 2003/0126356 A1 * | 7/2003 | Gustavson et al. | 711/105 |
| 2003/0195014 A1 * | 10/2003 | Mori et al. | 455/558 |
| 2003/0220101 A1 * | 11/2003 | Castrogiovanni et al. | 455/419 |
| 2004/0005912 A1 * | 1/2004 | Hubbe et al. | 455/558 |
| 2004/0043790 A1 * | 3/2004 | Ben-David et al. | 455/558 |
| 2004/0127256 A1 * | 7/2004 | Goldthwaite et al. | 455/558 |
| 2005/0101350 A1 * | 5/2005 | Wang | 455/558 |
| 2006/0208066 A1 * | 9/2006 | Finn et al. | 235/380 |

* cited by examiner

*Primary Examiner*—Lester G. Kincaid
*Assistant Examiner*—Diego Herrera

(57) ABSTRACT

A multi-swap communication module includes a motherboard and a daughterboard. The motherboard is provided with a plurality of necessary components for maintaining the operation of a wireless communication card and the daughterboard is connectable with the motherboard. The daughterboard is a modular add-on card swappable according to different requests, while the motherboard reads control data selectively either in the motherboard or in the daughterboard by means of a swapping action of the daughterboard.

6 Claims, 4 Drawing Sheets

MOTHERBOARD AND DAUGHTERBOARD MULTI-SWAP SYSTEM WITH COMMUNICATION MODULE FOR A GPRS SYSTEM

BACKGROUND OF THE INVENTION

1. Field of the Invention

The present invention relates generally to a communication module, and particularly to a multi-swap communication module that enables a conventional elementary wireless communication unit to swap the functions thereof.

2. The Prior Arts

To follow the development and progress of science, the transmission mode of information has been changed from a wire-mode to a wireless-mode of which the data portability and the convenience of transmission are significantly enlarged. It also makes the distance between people shorter and shorter such that data transmission and data receipt are no longer restricted at some predetermined positions. Instead, people can do the same in almost everywhere even under a moving state to make an instant remote communication and data exchange possible.

The wireless communication system more often applied nowadays includes the Global System for Mobile Communications (GSM), the General Packet Radio Service (GPRS), Bluetooth, and Wireless LAN.

The existing wireless communication card for wireless transmission is commonly applied in a portable computer or a Personal Digital Assistant (PDA) to serve as an expansion facility for wireless transmission to allow the connection with the INTERNET through a mobile phone system. In a conventional portable wireless communication card, the necessary device such as a wireless communication module (GSM, GPRS, Wireless network card or Bluetooth wireless card) is usually disposed on a motherboard module and connected with some other systems via a specified connection interface (Compact Flash interface, for example). Unfortunately, due to different interfaces of the wireless communication module, the wireless communication card occasionally fails to connect with other systems or a connection could be done only under the assistance of a personal computer (PC) or PDA that increases the cost but provides no convenient service.

SUMMARY OF THE INVENTION

The primary object of the present invention is to provide a multi-swap communication module capable of increasing the function of a conventional wireless communication card by means of a modular daughterboard having different functions.

Another object of the present invention is to save the cost of wireless communication by means of modular components.

In order to realize above objects, a multi-swap communication module of the present invention comprises a motherboard having basic components and a daughterboard to be connected with the motherboard, in which the daughterboard is a modular appended card swappable according to different requests, and the motherboard is supposed to read the control data either in the components thereof or in the components of the daughterboard by means of a swapping action of the daughterboard.

In accordance with the multi-swap communication module of the present invention, a multi-function controller is disposed on the motherboard for control of reading data on the daughterboard. This controller is employed to control reading of control data either on the motherboard or on the daughterboard selectively, and increase the functions of a wireless communication card of the motherboard by the modular daughterboard having various functions.

For more detailed information regarding advantages or features of the present invention, at least an example of preferred embodiment will be described below with reference to the annexed drawings.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENTS

Figure 1:
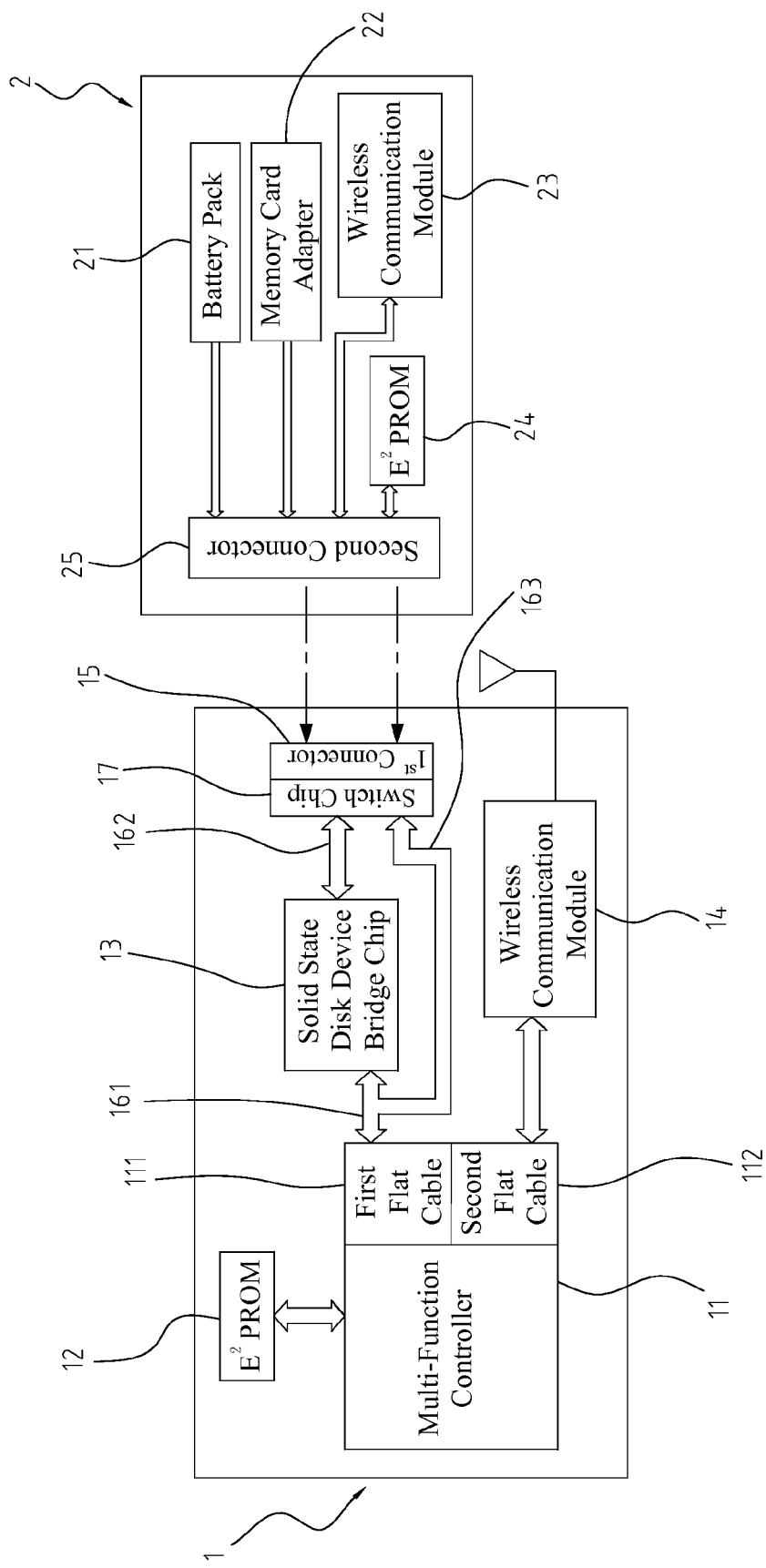
FIG. 1 is a schematic view of a GPRS (General Packet Radio Service) multi-swap communication module according to the present invention.
Figure 2:
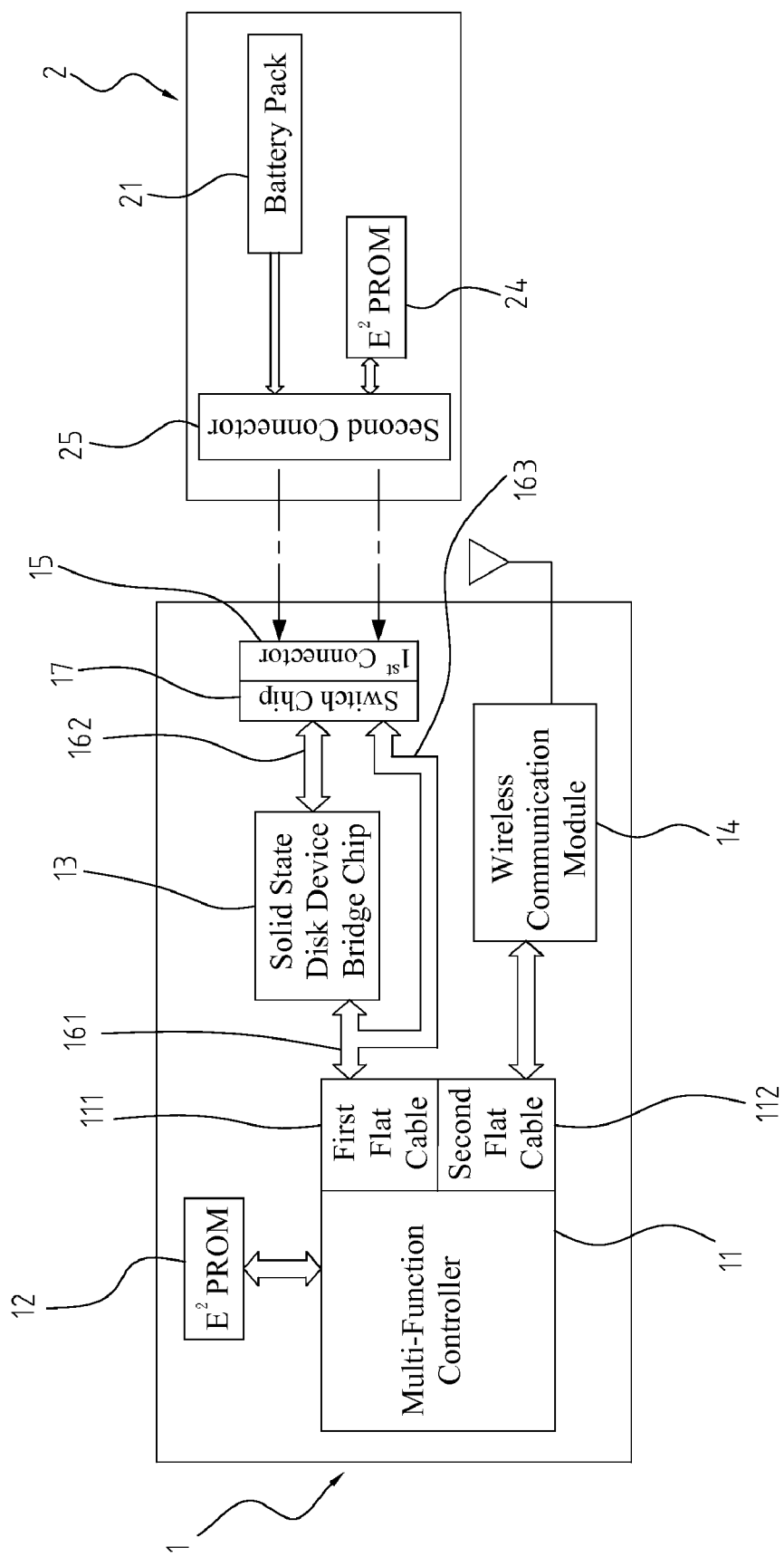
FIG. 2 is a schematic view of another embodiment of the GPRS multi-swap communication module according to the present invention.
Figure 3:
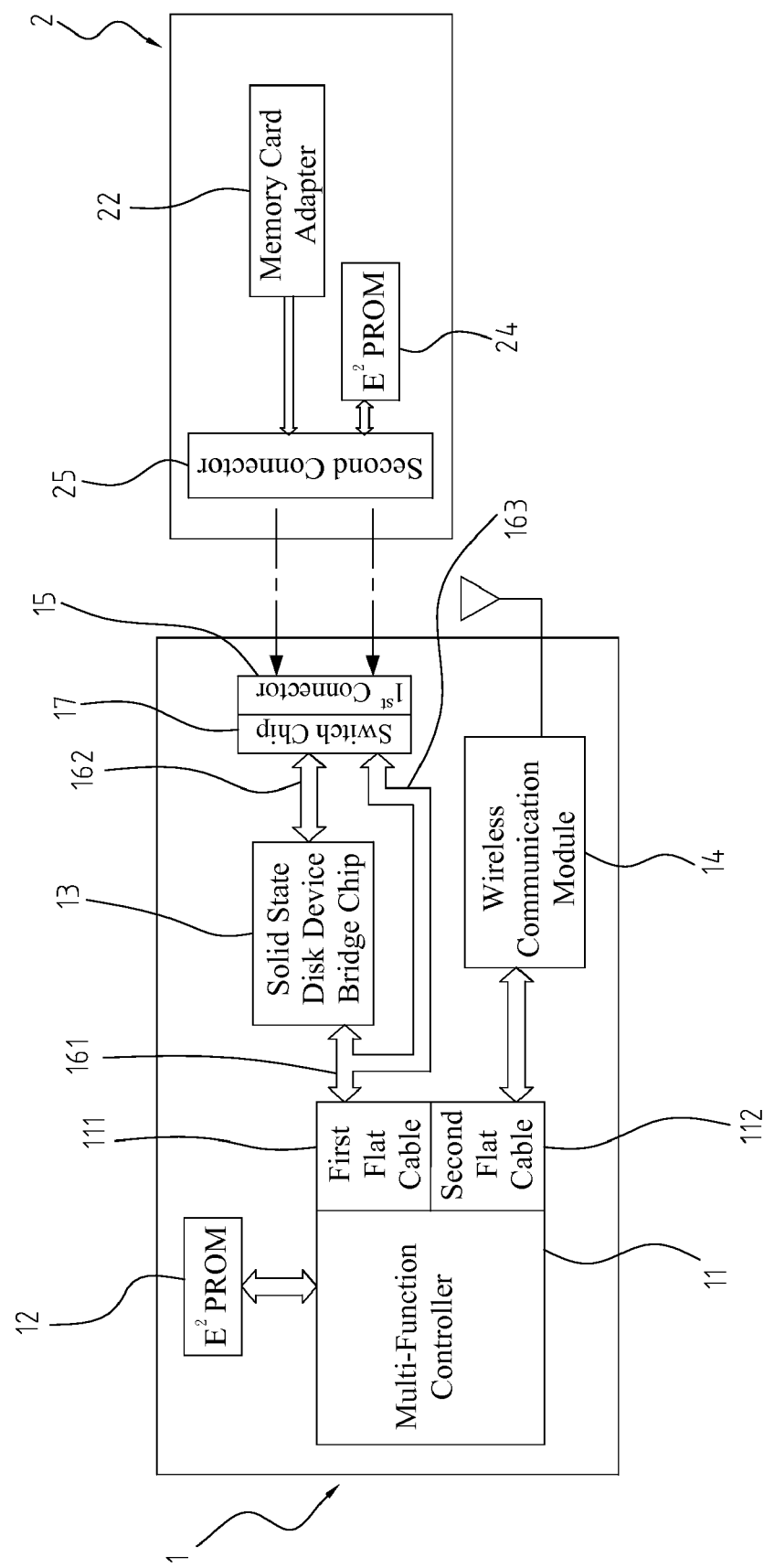
FIG. 3 is a schematic view of yet another embodiment of the GPRS multi-swap communication module according to the present invention.
Figure 4:
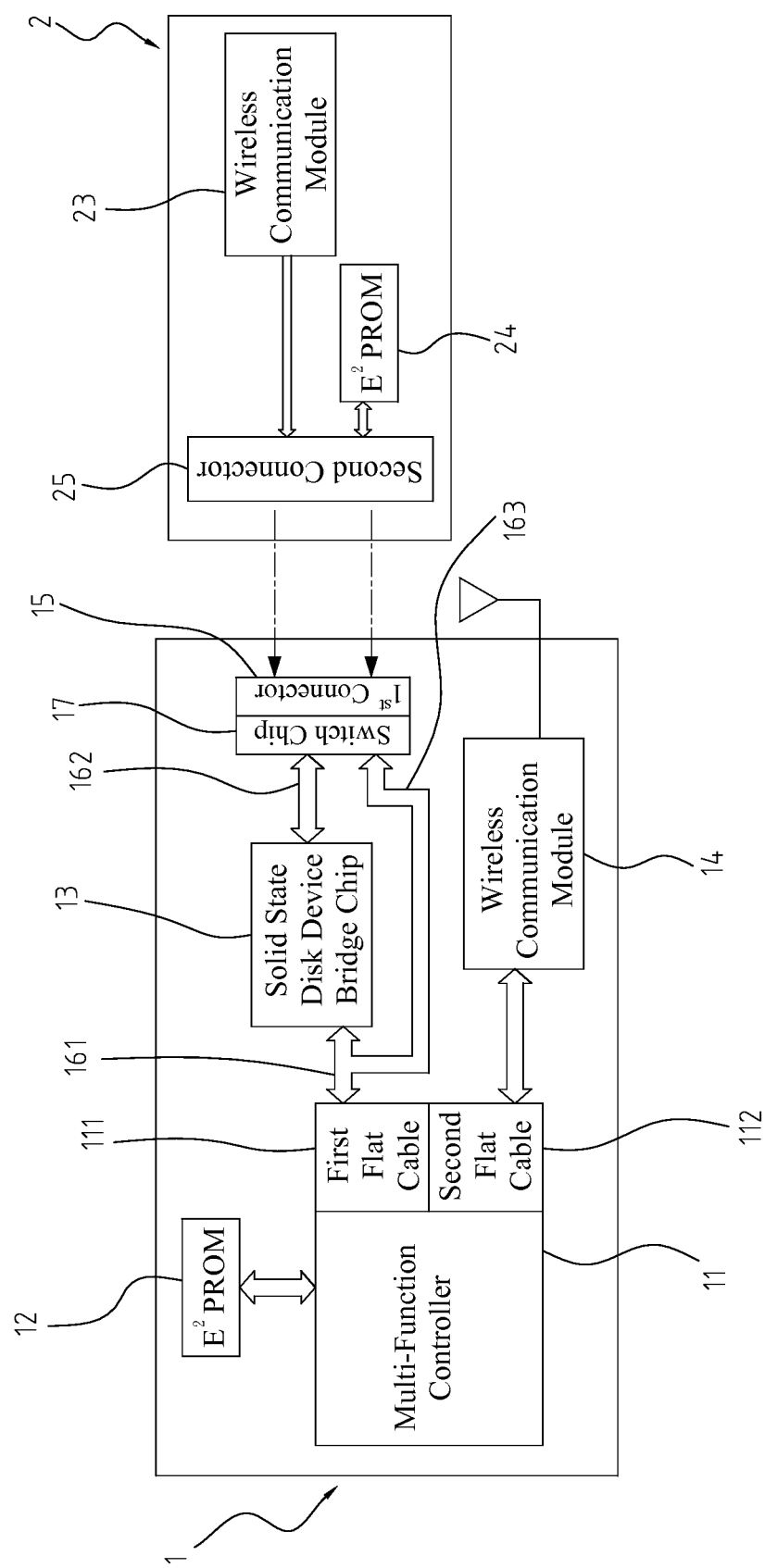
FIG. 4 is a schematic view of yet another embodiment of the GPRS multi-swap communication module according to the present invention.

With reference to FIG. 1, which shows a GPRS (General Packet Radio Service) multi-swap communication module according to the present invention, the multi-swap communication module of the present invention comprises a motherboard 1 and a daughterboard 2. A plurality of components is disposed on the motherboard 1, including at least a multi-function controller 11, an Electrically Erasable Programmable Read Only Memory ($E^2$PROM) 12, a Solid State Disk device bridge chip (SSD) 13, a wireless communication module 14, and a first connector 15. The multi-function controller 11 comprises first and second flat cables 111 and 112. The wireless communication module 14 comprises a replaceable module comprising preferably at least a wireless network, GSM, GPRS, or a Bluetooth wireless module. A plurality of components is disposed on the daughterboard 2, including at least an $E^2$PROM 24 and a second connector (25). Upon requests, a battery pack 21 (see FIG. 2), and/or a memory card adapter 22 (see FIG. 3), and/or a wireless communication module 23 (see FIG. 4) may be further provided to form a modular daughterboard 2 in various combinations.

The foregoing memory card adapter 22 can be, but not necessarily be, applied for a Multi Media card (MMC), a Safe Digital card (SD), or a Memory Stick Card (MS). The wireless communication module 23 preferably comprises a wireless network card or a Bluetooth wireless card. Or alternatively, the wireless communication modular 23 is replaced by a Global Positioning System (GPS) chip.

The possible combinations of the components on the daughterboard 2 can be, but not necessarily be, any of: (a) a battery pack only; (b) a memory card adapter only; (c) a wireless network card only; (d) a memory card adapter plus a battery pack; (e) a battery pack plus a Bluetooth wireless card; (f) a battery pack plus a wireless network card; or, (g) a battery pack plus a GPS card.

Therefore, a multi-swap communication module is formed by coupling a motherboard having a communication module with a modular daughterboard. The combination example of the motherboard and the daughterboard may include: (a) wireless network for motherboard; memory card (SD, MMC, or MS) adapter for daughterboard; (b) GSM or GPRS for motherboard; wireless network for daughterboard; (c) Bluetooth wireless card for motherboard; memory card (SD, MMC, or MS) adapter plus battery pack for daughterboard; (d) GSM or GPRS for motherboard; GPS plus battery pack for daughterboard; (e) wireless network for motherboard; memory card (SD, MMC, or MS) for daughterboard. Before the connection of the motherboard and the daughterboard is made, the motherboard (1) itself is staffed to read the data stored in advance in the $E^2PROM$ 12 through the multi-function controller 11. Then, after operation, an instruction is transmitted through the flat cable 112 to the wireless communication module 14 for the latter to proceed with the wireless transmission operation.

When the modular daughterboard 2 is joined together with the motherboard 1, the information thereof enters the motherboard 1 through a channel provided by the connectors 15 and 25. A chip-selection pin (CS pin, not shown) is then enabled or disabled to conduct ON/OFF operation of the $E^2PROM$ 12 on the motherboard 1 by taking advantage of the swapping action of the daughterboard 2 so that the prestored data either in the $E^2PROM$ 12 on the motherboard 1 or in the $E^2PROM$ 24 on the daughterboard 2 will be read selectively via the multi-function controller 11.

The mentioned multi-function controller 11 may support various working modes as indicated in Table 1, in which modes 1-3 are all multiplex modes while modes 4-6 are all simplex modes. The multiplex modes 11 make use themselves on swap of the modules.

The data fetched from the daughterboard 2, that is, from the $E^2PROM$ 24 or the memory card adapter 22 or the wireless communication module 23, could be transmitted through the first connector 15, and then the flat cable 111 to reach the multi-function controller 11 for the controller to operate a wireless communication card. This can be done via any of two paths, in which the fetched data may go through the first connector 15 and then a bus 162, the Solid State Disk device bridge chip 13, and another bus 161 to reach the multi-function controller 11 along one path, or the data may go through the first connector 15 and then a bus 163 to reach the multi-function controller 11 along the other path without passing through the Solid State Disk device bridge chip 13. The path for transmitting data from the daughterboard 2 to the motherboard 1 is to be chosen by a switching chip 17.

The Solid State Disk device bridge chip 13 is employed generally to transmit the data of the swappable daughterboard 2, namely the SD, MMC, MS, to the True Integrated Drive Electronics (True IDE), and it works just like a PCMCIA (Personal Computer Memory Card Interface Adapter).

Moreover, the $E^2PROM$ 12, 24 function to: (1) store the Card Information Structure (CIS) of PCMCIA and (2) store a setting value for configuring the multi-function controller 11 to determine the working mode thereof. For example, there are 256 bytes in an $E^2PROM$ 93C56, in which CIS is addressed in 00-EF to store the setting value of the $E^2PROM$ 93C56 as indicated in Table 2. When the electric power is applied, all the data of the $E^2PROM$ 93C56 is supposed to be inputted into the multi-function controller, in which 240 bytes of CIS data would reside in a RAM buffer and the rest 16 bytes are employed for setting the multi-function controller, then the system host will effect a reset signal to determine the working mode of the multi-function controller and decide the function thereof when the CIS of PCMCIA works in an operating system. In other words, the function of the CIS of PCMCIA is determined first by the data of those 16 bytes and the reset signal of the system host, then the operating system will define the function thereof in Win98/2K/CE.

In the above described, at least one preferred embodiment has been described in detail with reference to the drawings annexed, and it is apparent that numerous changes or modifications may be made without departing from the true spirit and scope thereof, as set forth in the claims below.

What is claimed is:

1. A multi-swap system with communication module for General Packet Radio Service (GPRS) comprising:
   a motherboard having a multi-function controller, a first bus connected to said multi-function controller, a second bus, a solid state disk bridge chip connected to said first and second buses, a switching chip connected to said second bus, a third bus connecting said switching chip to said first bus, a wireless communication module, and a memory for storing control data, said motherboard operating as a wireless communication card; and
   a daughterboard swappably connected to said motherboard, said daughterboard having a memory for storing control data;
   wherein said multi-function controller selectively reads control data from the memory on said daughterboard or the memory on said motherboard depending on whether said daughterboard is connected to said motherboard, and the control data includes a setting value for configuring said multi-function controller for different working modes including multiplex and simplex modes; and wherein said switching chip controls if the control data on said daughterboard pass through said solid state disk bridge chip or said third bus to said multi-function controller when said daughterboard is connected to said motherboard.

2. The multi-swap system according to claim 1, wherein said memory in said motherboard is an Electrically Erasable programmable Read Only Memory ($E^2PROM$).

3. The multi-swap system according to claim 1, wherein the daughterboard is provided with at least an $E^2PROM$ and a connector, and further, at least one of four components including a battery pack, a memory slot, a Global Positioning System (GPS) module, or a wireless communication module.

4. The multi-swap system according to claim 1, wherein said switching chip controls said multi-function controller to selectively read control data from the memory on said daughterboard or the memory on said motherboard.

5. The multi-swap system according to claim 1, wherein the operation of the switching chip depends on a swapping action of the daughterboard that performs an ON/OFF operation of a pin in the switching chip.

6. The multi-swap system according to claim 1, wherein said switching chip passes data stored in a multi media card, a safe digital card, or a memory stick on said daughterboard through said solid state disk bridge chip to said multi-function controller when said daughterboard is connected to said motherboard.

* * * * *